(12) United States Patent
Van Buskirk et al.

(10) Patent No.: US 6,205,074 B1
(45) Date of Patent: Mar. 20, 2001

(54) TEMPERATURE-COMPENSATED BIAS GENERATOR

(75) Inventors: Michael A. Van Buskirk, Saratoga; Bhimachar Venkatesh, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/610,764

(22) Filed: Jul. 6, 2000

Related U.S. Application Data
(60) Provisional application No. 60/186,172, filed on Feb. 29, 2000.

(51) Int. Cl.[7] .................................................. G11C 7/00
(52) U.S. Cl. ................ 365/211; 365/189.09; 365/185.22
(58) Field of Search ............................... 365/211, 189.09, 365/185.23, 185.22; 326/32, 33

(56) References Cited

U.S. PATENT DOCUMENTS

| | | | |
|---|---|---|---|
| 5,303,191 | * 4/1994 | Eagan et al. | 365/211 |
| 5,418,751 | * 5/1995 | Kaiser | 365/211 |
| 5,768,189 | * 6/1998 | Takahashi | 365/189.09 |
| 5,793,691 | * 8/1998 | Mullarney | 365/211 |
| 5,864,504 | * 1/1999 | Tanzawa et al. | 365/185.22 |
| 5,875,142 | * 2/1999 | Chevallier | 365/211 |

* cited by examiner

Primary Examiner—Tan T. Nguyen
(74) Attorney, Agent, or Firm—Brinks Hofer Gilson & Lione

(57) ABSTRACT

The present invention discloses methods and systems for generating a bias voltage during an Automatic Program Disturb Erase Verify (APDEV) operation in a memory device. During the APDEV operation, a predetermined supply voltage is generated by a regulated power supply. The predetermined supply voltage is directed to a temperature-compensated bias generator circuit. The temperature-compensated bias generator circuit is activated to generate the bias voltage based on the operating temperature of the memory device.

27 Claims, 4 Drawing Sheets

TEMPERATURE-COMPENSATED BIAS GENERATOR

This application claims the benefit under 35 U.S.C. §119(e) of Provisional U.S. patent application Ser. No. 60/186,172, filed on Feb. 29, 2000.

FIELD OF THE INVENTION

The present invention relates generally to non-volatile memory devices and, more particularly, to a method for generating a bias voltage during APDE verify in flash electrically erasable programmable read-only memory (flash EEPROM) devices.

BACKGROUND OF THE INVENTION

A flash memory is a storage device that is capable of retaining stored information in the absence of continuous power. The information is stored in a plurality of flash transistors that are electrically connected and formed on a silicon substrate. A flash transistor is typically referred to as a cell and includes a source, a drain, a floating gate and a control gate. Flash memory devices are formed by rows and columns of flash transistors that form a flash transistor array. As known in the art, the control gates of the cells are electrically connected with a respective wordline and the drains of the cells are electrically connected with a respective bitline. The source of each cell is electrically connected with a common source line.

The information stored in each particular cell represents a binary one or zero, as known in the art. To perform a program, read or erase operation of a particular cell in the array, a respective voltage is applied to a predetermined wordline, bitline and sourceline. By applying the voltages to a select bitline column and a select wordline row, an individual cell can be read or programmed.

To program a respective cell, the control gate and the drain of the cell are raised to respective predetermined programming voltages and the source is grounded. When the programming voltages are placed on the control gate and the drain, hot electrons are generated that are injected onto the floating gate where they are trapped forming a negative charge. This electron transfer mechanism is often referred to as Channel Hot Electron (CHE) injection in the semiconductor industry. When the programming voltages are removed, the negative charge on the floating gate is maintained, thereby raising the threshold voltage of the cell. The threshold voltage is used when the cell is read to determine if it is in a charged (programmed) or an uncharged (un-programmed) state.

Cells are read by applying a predetermined voltage to the control gate and the drain, grounding the source of the cell and then sensing the current in the bitline. If the cell is programmed, the threshold voltage will be relatively high and the bitline current will be zero or at least relatively low when a read voltage is applied between the control gate and the source of the cell. If the cell is erased, the threshold voltage will be relatively low and the bitline current will be relatively high when the same read voltage is applied.

In contrast to the programming procedure, flash memory devices are typically bulk-erased, so that all of the cells in a memory sector are simultaneously erased. A memory sector describes the number of wordlines and bitlines in the array and can be formed to include 512 wordlines and 1024 bitlines in a 64-kbyte array. Erasing memory sectors can be performed in several ways involving the application of a set of predetermined voltages to the common sourceline, the bitlines and the wordlines. This causes electron tunneling from the floating gate to the source through Fowler-Nordheim (F-N) tunneling, which removes the negative charge from the floating gate of the cells in the memory sector.

Cells are typically erased by application of an erase pulse to the memory sector targeted for erasure for a predetermined time. Ideally, each cell in the memory sector requires the same amount of time to remove electrons from the floating gate. In reality, erase times among the cells within the memory sector vary and some of the cells subjected to the erase pulse may become over-erased. The threshold voltage of an over-erased cell is lowered to the point that it can cause excessive leakage current in the bitline. Excessive leakage current can prevent proper reading of programmed cells in the bitline of the memory sector.

It is known in the art that to correct for excessive leakage current, the bitlines are verified during an Automatic Program Disturb Erase Verify (APDEV) operation that occurs automatically as part of an Automatic Program Disturb Erase (APDE) operation. The APDEV operation verifies that each bitline in a particular sector does not contribute excessive leakage current above a predetermined reference current and takes corrective action if necessary. The predetermined reference current is obtained by sensing the bitlines of at least one reference cell.

During the APDEV operation, a bias voltage is applied to all the wordlines in the sector and each bitline in the sector is sequentially sensed for current above the predetermined reference current. The bias voltage is also applied to the wordlines of the reference cells to obtain the predetermined reference current. If the bitline current is above the reference current, a stress operation is performed on all the cells in the bitline. A stress operation is known in the art as a soft program that mainly affects the over-erased cells by raising their threshold voltage. After the stress operation, the bitline current is sensed again and the stress operation is repeated if necessary until the current sensed on the bitline during the APDEV operation is below the reference current.

The leakage current generated when the bias voltage is applied to the cells varies with the operating temperature of the flash memory. A known problem occurs during the erase operation when the temperature variations of the flash memory are enough to disturb the accuracy of the leakage current sensing. When the operating temperature varies, the leakage current of the cells in the bitlines varies to a greater degree than the leakage current of the reference cells. The non-uniform variations in the leakage currents may cause an erroneous bitline current or an erroneous predetermined reference current during the APDEV operation.

If the leakage current of the cells on the bitlines is erroneously too high, or if the reference current is erroneously too low, the stress and APDEV operations will be repeated. Repetition of the stress and APDEV operations undesirably lengthens the duration of the erase operation. In addition, temperature variations that allow the leakage current in the bitlines to be erroneously determined acceptable, causes erroneous results when the programmed cells in the bitlines are later read.

For the foregoing reasons, a need exists to temperature compensate the generation of the leakage current and the predetermined reference leakage current as the operating temperature of the flash memory varies.

SUMMARY OF THE INVENTION

The present invention discloses methods and systems of generating a bias voltage during an APDEV operation in a memory device that, in the preferred embodiment, is a flash memory. The preferred flash memory includes a charge share circuit and a temperature-compensated bias generator circuit that are electrically connected to at least one pass gate. In addition, the charge share circuit is electrically connected with the temperature-compensated bias generator circuit. The pass gates are electrically connected with at least one wordline located in a memory sector of the flash memory.

During the APDEV operation, the charge share circuit generates a first predetermined voltage that is directed to the wordlines through the pass gates. After the charge share circuit charges the wordlines to a base voltage, the temperature-compensated bias generator circuit generates a second predetermined voltage that is directed with the pass gates to the wordlines. The second predetermined voltage is temperature-compensated and charges the wordlines to a bias voltage.

The second predetermined voltage is equal to the bias voltage that is needed to verify the bitlines in a respective memory sector at the present operating temperature of the flash memory. Verification of the bitlines involves charging the wordlines of a respective memory sector to the bias voltage and measuring a resulting leakage current on the bitlines for comparison to a predetermined reference leakage current. Cells electrically connected with the wordlines and bitlines that were not properly erased create leakage current on the respective bitline that exceeds the reference leakage current. In the preferred flash memory, temperature fluctuations that would otherwise undesirably vary the magnitude of the leakage currents have no effect due to the bias voltage supplied by the temperature-compensated bias generator circuit.

The temperature-compensated bias generator circuit includes a wordline enable circuit, a temperature adjustment circuit, a source bias circuit and a discharge circuit. The wordline enable circuit is electrically connected with the temperature adjustment circuit. The temperature adjustment circuit is activated by the wordline enable circuit to generate the bias voltage during the APDEV operation. Generation of the bias voltage is accomplished using a resistor chain. The resistance of the resistor chain fluctuates as the operating temperature of the flash memory varies thereby temperature compensating the bias voltage.

The bias voltage is generated with the temperature adjustment circuit using a predetermined supply voltage. A regulated power supply generates the predetermined supply voltage. The predetermined supply voltage is directed to the temperature adjustment circuit where the predetermined supply voltage is controlled by the resistor chain to generate the bias voltage. The bias voltage is then directed to the wordlines that are electrically connected with the temperature adjustment circuit.

Another preferred embodiment of the present invention comprises the temperature adjustment circuit electrically connected with at least one reference wordline. The reference wordlines are electrically connected with at least one reference cell. The temperature-compensated bias generator circuit generates the bias voltage that is directed to the reference wordlines as in the previously set forth preferred embodiment. This preferred embodiment of the temperature-compensated bias generator circuit includes the wordline enable circuit and the temperature adjustment circuit. In addition, the charge share circuit does not provide the first predetermined voltage to the reference wordlines as in the previous preferred embodiment.

In another preferred embodiment, the reference cells are associated with at least one memory sector. The reference cells are configured to provide a predetermined reference leakage current that corresponds to the size of the associated memory sector. The reference leakage current is generated when the bias voltage is directed to the reference wordlines as in the previous preferred embodiment. The reference leakage current is thereby adjusted by sensing the reference leakage current of the reference cell associated with the memory sector subject to the APDEV operation.

The present invention further discloses a method of generating a bias voltage during an APDEV operation in a memory device that, in the preferred embodiment, is a flash memory. During the APDEV operation, a predetermined supply voltage is generated by a regulated power supply and directed to a temperature adjustment circuit. The temperature adjustment circuit is activated to generate the bias voltage by a wordline enable circuit. The bias voltage is generated with the predetermined supply voltage and a resistor chain based on an operating temperature of the flash memory as in the previous preferred embodiments. The bias voltage is directed by the pass gates to the wordlines, thereby charging the wordlines to the bias voltage.

In another preferred embodiment, the wordline enable circuit activates the temperature adjustment circuit that is electrically connected with the reference wordlines. In addition, the wordline enable circuit also activates the temperature adjustment circuit that is electrically connected with the wordlines in the respective memory sector. The preferred bias voltage that is directed to the wordlines in the respective memory sector is in a range of about 104 to 572 millivolts. The reference wordlines are charged with the preferred bias voltage that is in a range of about 522 to 765 millivolts. The independently generated bias voltages on the reference wordlines and on the wordlines in the memory sector respectively generate the reference leakage current and the leakage current. If the leakage current of the bitlines in the memory sector is greater than the reference leakage current, corrective actions are taken and the APDEV operation is repeated.

Since the bias voltages applied to the reference wordlines and the wordlines in the memory sector are independently temperature-compensated, the respective leakage currents remain accurate. If the APDEV operation is accurate at the current operating temperature of the flash memory, the erase operation that includes the APDEV operation will be completed efficiently. Efficiency is achieved by minimizing the number of times the APDEV operation is performed to complete verification of the bitlines in the memory sector. In addition, errors in reading the programmed cells in the bitlines are minimized.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the present invention are set forth below with reference to specific configurations. Those skilled in the art would recognize that various changes and modifications can be made on the specific configurations while remaining within the scope of the claims. The invention may be used with any type of memory device requiring over-erase correction; however, the preferred embodiment of the invention is designed for flash memory.

All electrical parameters are given by example and can be modified for use with various memory devices using other electrical parameters. For example, in the preferred embodiment, a supply voltage (Vcc) is considered 3.0 V volts, but could alternatively be 5 V, 1.8 V, or some other supply voltage. As known in the art, if a different supply voltage is chosen, the various operational levels would be modified to accommodate the different supply voltage.

Figure 1:
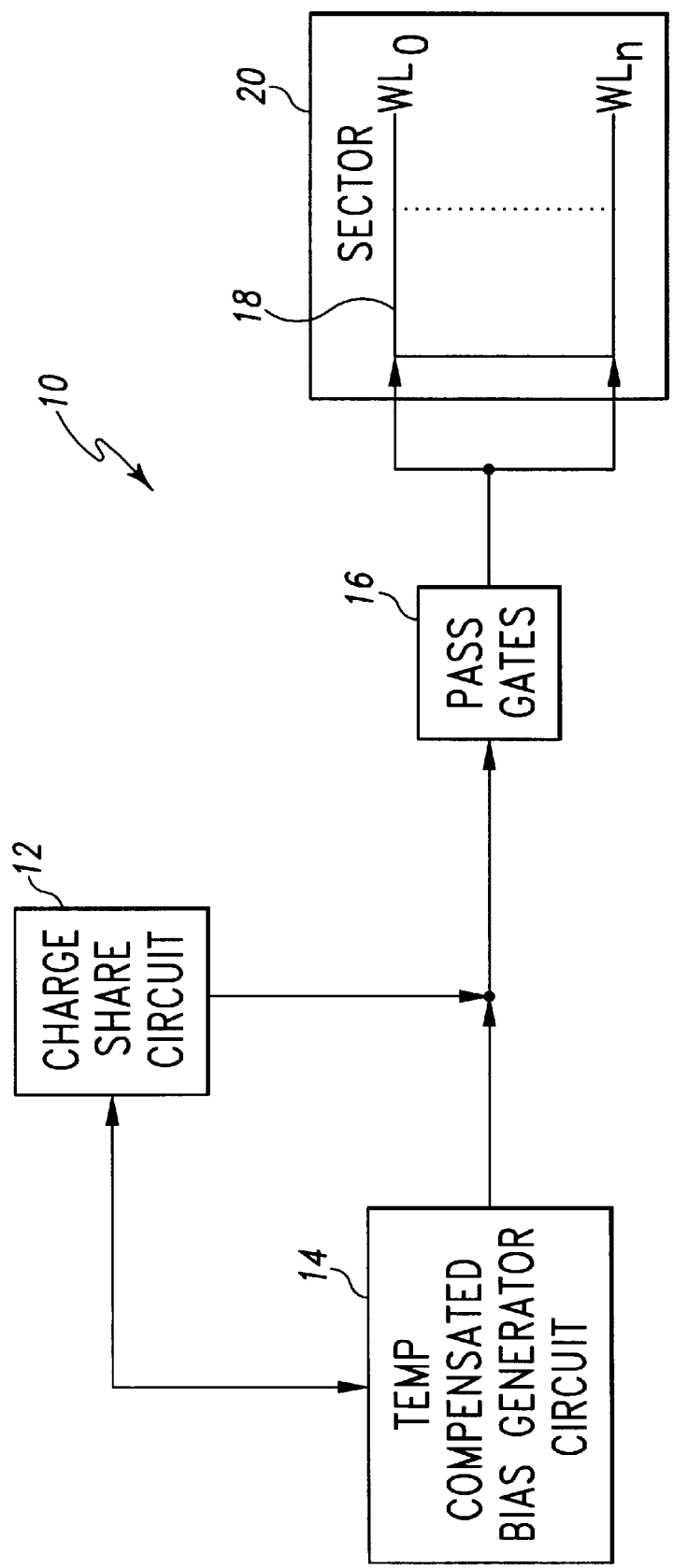
FIG. 1 represents a block diagram of a portion of a preferred flash memory incorporating the presently disclosed invention.

FIG. 1 illustrates a block diagram of a portion of a preferred flash memory 10 that incorporates an embodiment of the present invention. The flash memory 10 includes a charge share circuit 12, a temperature-compensated bias generator circuit 14, at least one pass gate 16 and at least one wordline 18 located in a memory sector 20. The output of the charge share circuit 12 and the output of the temperature-compensated bias generator circuit 14 are electrically connected with the pass gates 16 of the preferred embodiment. In addition, the charge share circuit 12 is electrically connected with the temperature-compensated bias generator circuit 14. The output of the pass gates 16 is electrically connected with the wordlines 18 in the respective memory sector 20. The pass gates 16 are used to direct voltages generated by the charge share circuit 12 and the temperature-compensated bias generator circuit 14 to the wordlines 18 during the APDEV operation.

During the APDEV operation, the charge share circuit 12 is used by the flash memory 10 to generate a first predetermined voltage that is directed to the wordlines 18 by the pass gates 16. After a predetermined amount of time, the temperature-compensated bias generator circuit 14 is used by the flash memory 10 to generate a second predetermined voltage. The second predetermined voltage is a bias voltage that is directed to the wordlines 18 through the pass gates 16. The magnitude of the bias voltage generated by the temperature compensated bias generator 14 is based on the operating temperature of the flash memory 10.

The charge share circuit 12 and the temperature-compensated bias generator circuit 14 work sequentially to quickly charge the wordlines 18 to the bias voltage during the APDEV operation. The bias voltage is the magnitude of voltage needed to properly verify the bitlines in the respective memory sector 20 during the APDEV operation at the present operating temperature of the flash memory 10. Verification of the bitlines involves charging the wordlines 18 of the respective memory sector 20 to the bias voltage and measuring a resulting leakage current on the bitlines for comparison with a predetermined reference leakage current. Cells electrically connected with the wordlines and bitlines that were not properly erased create leakage current on the respective bitline that exceeds the reference leakage current. Excessive leakage current can prevent proper reading of programmed cells in the bitlines of the memory sector 20.

In the preferred embodiment, the accuracy of the leakage currents during the APDEV operation is maintained by temperature-compensating the bias voltage. As the operating temperature increases, the magnitude of the bias voltage is reduced by the temperature-compensated bias generator circuit 14. Conversely, as the operating temperature decreases, the magnitude of the bias voltage is increased.

For a detailed discussion of the charge share circuit 12, refer to co-pending and commonly assigned U.S. patent application Ser. No. 09/547,747, entitled "CHARGE SHARING TO HELP BOOST THE WORDLINES DURING APDE VERIFY" to Venkatesh, et al., that was filed on the same day as the present application and is herein incorporated in its entirety.

Figure 2:
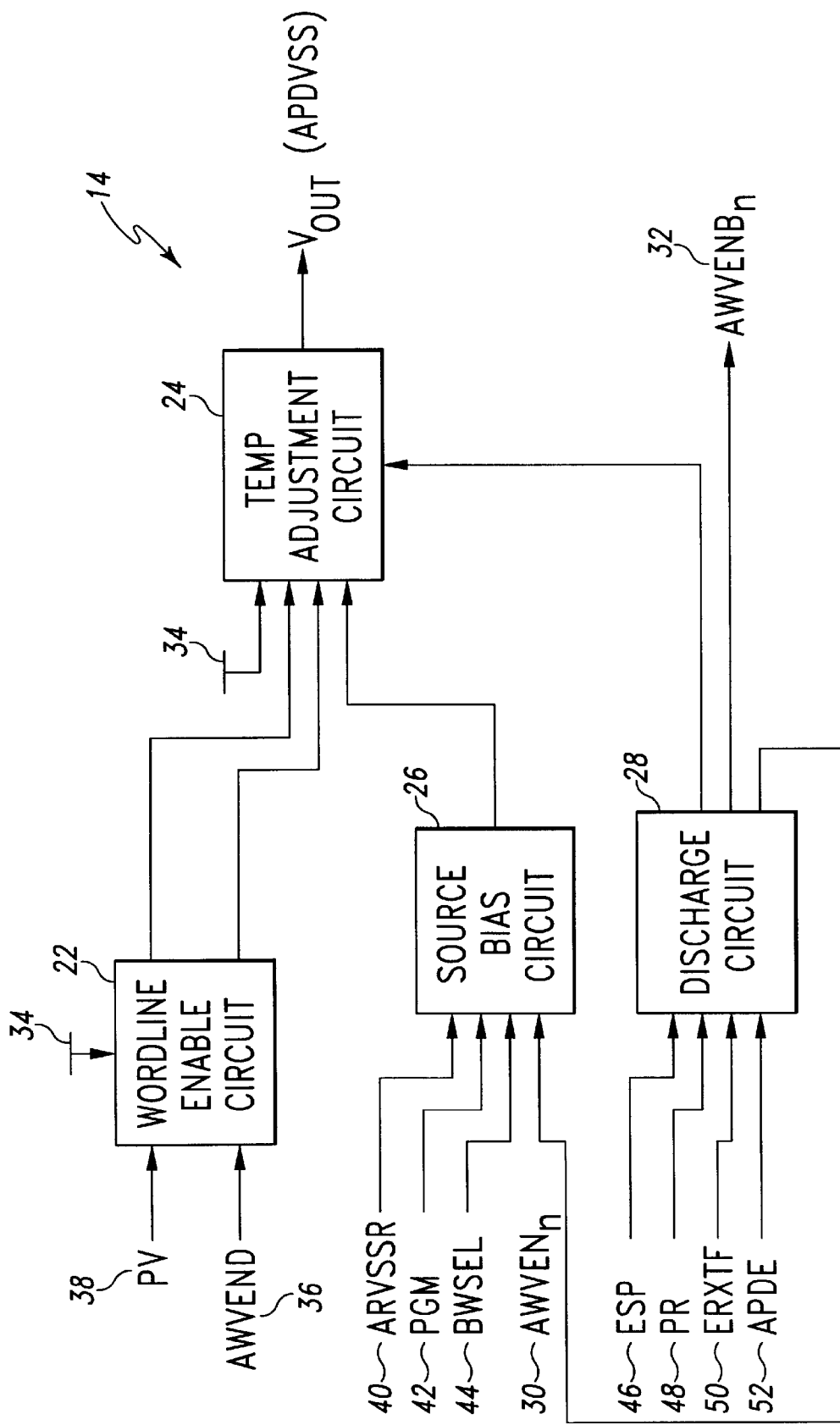
FIG. 2 is a block diagram of a preferred temperature-compensated bias generator circuit.

Referring to FIG. 2, a block diagram of the preferred temperature-compensated bias generator circuit 14 is illustrated. The temperature-compensated bias generator circuit 14 includes a wordline enable circuit 22, a temperature adjustment circuit 24, a source bias circuit 26, and a discharge circuit 28. The wordline enable circuit 22 is electrically connected with the temperature adjustment circuit 24. The temperature adjustment circuit 24 is also electrically connected with the source bias circuit 26 and the discharge circuit 28. The discharge circuit 28 is electrically connected with the source bias circuit 26 through an AWVENn line 30. Although not illustrated, the discharge circuit 28 is also electrically connected with the charge share circuit 12 through the AWVENBn line 32. A regulated power supply 34 is electrically connected with the wordline enable circuit 22 and the temperature adjustment circuit 24 as illustrated.

The wordline enable circuit 22 is electrically connected with an AWVEND line 36 and a ProgramVerify line 38. Although not illustrated, the AWVEND line 36 electrically connects the wordline enable circuit 22 with the charge share circuit 12. The Program Verify line 38 electrically connects the wordline enable circuit 22 with a state machine (not shown).

As known in the art, the state machine is used to control the overall operation of the flash memory 10 in response to instruction sets that are received by the state machine. In the preferred embodiment, it is only necessary to understand that the state machine generates predetermined control signals during the APDEV operation that are directed to the temperature compensated bias generator circuit 14. The state machine also generates control signals on an ARVSSR source bias line 40, a PGM control line 42 and a BWSEL control line 44 that are electrically connected with the source bias circuit 26. In addition, control signals on an ESP control line 46, a Program Reset line 48, an ERXTF control line 50 and a Automatic Program Disturb Erase line 52 that are electrically connected with the discharge circuit 28 are also generated by the state machine.

Figure 3:
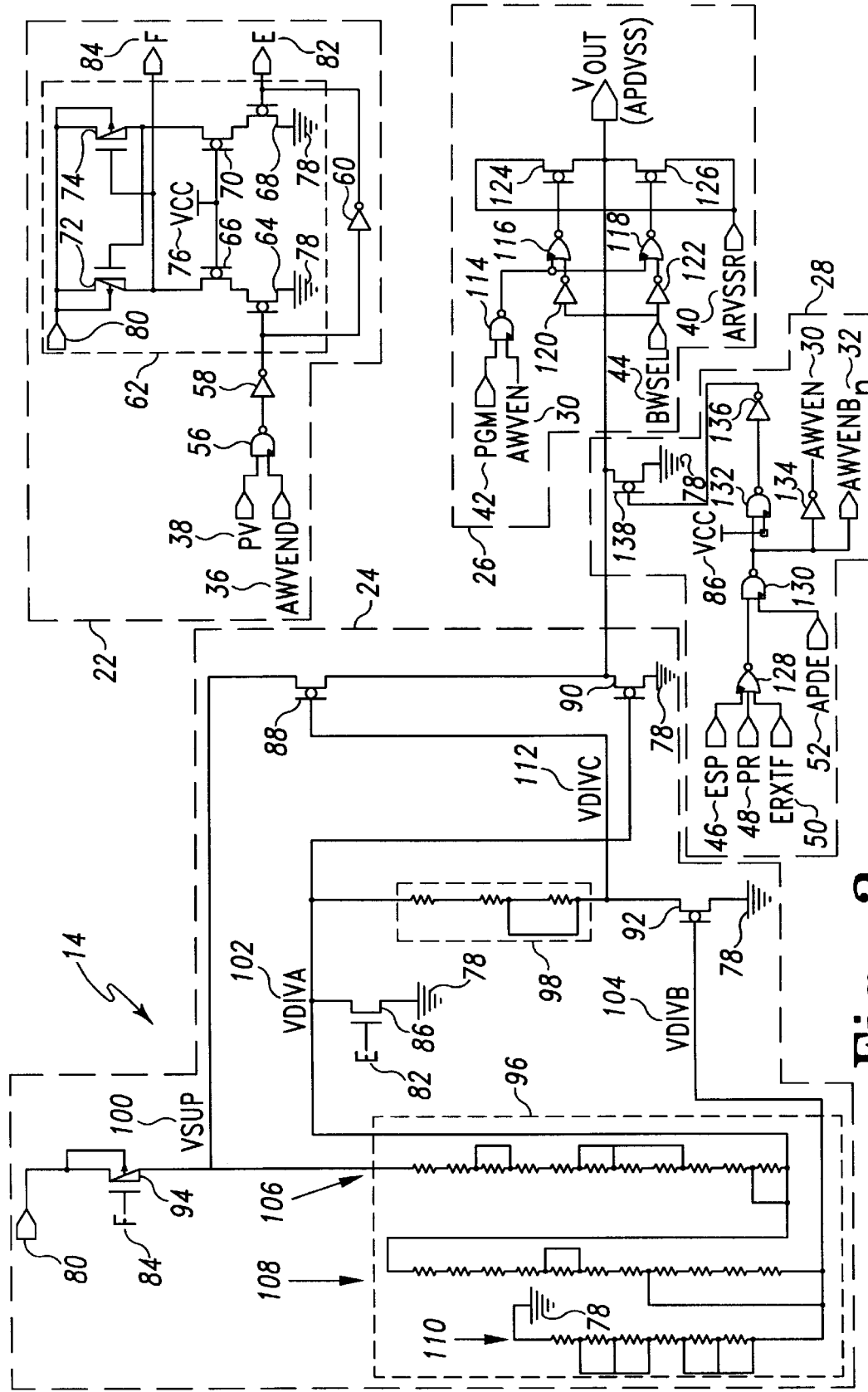
FIG. 3 is a circuit schematic of a preferred temperature-compensated bias generator circuit.

FIG. 3 illustrates a circuit schematic of the preferred temperature-compensated bias generator circuit 14. The preferred wordline enable circuit 22 includes a NAND gate 56, a plurality of inverters 58–60 and a level shifter 62 electrically connected as illustrated in FIG. 3. The preferred level shifter 62 includes a plurality of n-channel transistors 64–70 and a plurality of p-channel transistors 72–74 electrically connected as illustrated. The level shifter 62 is also electrically connected with a supply voltage (Vcc) connection 76, a ground connection 78 and a regulated power supply connection 80.

In the preferred embodiment, the wordline enable circuit 22 activates the temperature adjustment circuit 24. The wordline enable circuit 22 is activated by conducting electric signals generated by the state machine (not shown) and the charge share circuit 12 as previously set forth. When activated, the wordline enable circuit 22 directs non-conducting electric signals to the temperature adjustment circuit 24. The non-conducting electric signals are generated on a ground connection line (E) 82 and a voltage connection line (F) 84 from inverter 60 and the level shifter 62, respectively.

The preferred level shifter 62 is an inverting level shifter. As known in the art, level shifters transfer voltage when activated by an electric signal. In the preferred embodiment, the level shifter 62 transfers the predetermined supply voltage present on a regulated power supply connection 80 when a non-conducting electric signal is generated by inverter 58. When a conducting electric signal is generated by inverter 58, the voltage connection line (F) 84 is electrically connected with the ground connection 78. In the preferred embodiment, the predetermined supply voltage present on the regulated power supply connection 80 is about 5 V and is supplied by the regulated power supply 34 illustrated in FIG. 2. The predetermined supply voltage is regulated to maintain an almost constant magnitude of voltage during operation of the flash memory 10.

Referring again to FIG. 3, the preferred temperature adjustment circuit 24 includes a plurality of n-channel transistors 86–92, a p-channel transistor 94, a first resistor chain 96 and a second resistor chain 98 electrically connected as illustrated. In addition, the temperature adjustment circuit 24 is electrically connected to the ground connection 78 and the regulated power supply connection 80. The temperature adjustment circuit 24 controls the generation of the temperature-compensated bias voltage.

When the preferred temperature adjustment circuit 24 is activated, the predetermined supply voltage present on the regulated power supply connection 80 is passed to a voltage supply node (VSUP) 100 by activation of p-channel transistor 94. In addition, a first voltage divider node (VDIVA) 102 is electrically isolated from the ground connection 78 by deactivation of n-channel transistor 86. N-channel transistor 86 is deactivated and p-channel transistor 94 is activated by non-conducting electric signals on the ground connection line (E) 82 and the voltage connection line (F) 84, respectively, that are generated by the wordline enable circuit 22 as previously set forth.

The voltage supply node (VSUP) 100 is electrically connected with the drain of n-channel transistor 88 and the first resistor chain 96 as illustrated in FIG. 3. The preferred first resistor chain 96 comprises a plurality of p-plus and n-well resistors configured to provide a predetermined resistance. In the preferred embodiment, the p-plus and n-well resistors have temperature coefficients that change at a predetermined rate with respect to temperature. Those skilled in the art would recognize that the doping of the p-plus and n-well resistors during fabrication causes the resistance to change at different rates during operation.

The n-well resistors have a temperature coefficient that causes the resistance to change at a first predetermined rate that is linear as the operating temperature changes. The p-plus resistors have a temperature coefficient that causes the resistance to change linearly at a second predetermined rate as the operating temperature changes. The selective combination of the p-plus and n-well resistors in the first resistor chain 96 create a predetermined slope of changing resistance with respect to the operating temperature range of the flash memory 10.

The first resistor chain 96 is electrically connected to create a voltage divider. The voltage divider supplies a first predetermined divider voltage on the first divider node (VDIVA) 102 and a second predetermined divider voltage on a second divider node (VDIVB) 104. In the preferred embodiment, the magnitude of the first and second predetermined divider voltages is in a range of about 0.7 to 1.5 V and about 0.5 to 1.0 V, respectively. The ranges of the first and second predetermined divider voltages correspond to the range of bias voltage needed on the wordlines 18 of the respective memory sector 20 to accurately perform the APDEV operation.

Variation of the magnitude of the first and second predetermined divider voltages is dependent on the operating temperature of the flash memory 10. As the operating temperature varies, the resistance of the first resistor chain 96 also varies as previously set forth. In the preferred embodiment, the first resistor chain 96 is configured such that the n-well resistors are located in a first block 106 and provide voltage drop prior to the first divider node (VDIVA) 102. In addition, the p-plus resistors are located in a second block 108 of the first resistor chain 96 and provide voltage drop between the first divider node (VDIVA) 102 and the second divider node (VDIVB) 104. A third block 110 of the first resistor chain 96 comprises n-well resistors and is electrically connected with the ground connection 78 as illustrated in FIG. 3.

When the operating temperature of the flash memory 10 decreases, the resistance of the n-well resistors in the first and third blocks 106, 110 decreases at the first predetermined rate. Similarly, the resistance of the p-plus resistors in the second block 108 decreases at the second predetermined rate. Conversely, the resistance of the first and third blocks 106, 110 and the resistance of the second block 108 increases at the respective first and second predetermined rates when the operating temperature of the flash memory 10 increases. The first and second predetermined rates, and the resistance of the first, second and third blocks 106, 108, 110 are capable of being calculated by those skilled in the art based on the operating temperature range of the flash memory 10. In the preferred embodiment, the operating temperature of the flash memory 10 ranges from about −55 to 125 degrees Celsius.

The first divider node (VDIVA) 102 and the second divider node (VDIVB) 104 are electrically connected with the control gates of n-channel transistors 90 and 92, respectively. The magnitudes of the first and second predetermined divider voltages control the respective activation of n-channel transistors 90 and 92. When activated, n-channel transistors 90 and 92 discharge current to the ground connection 78. The first divider node (VDIVA) 102 is also electrically connected with the second resistor chain 98 as illustrated in FIG. 3. The preferred second resistor chain 98 comprises a plurality of n-well resistors configured to provide a predetermined resistance. The resistance of the second resistor chain 98 also varies linearly at a third predetermined rate with changes in the operating temperature of the flash memory 10. In the preferred embodiment, the voltage drop of the second resistor chain 98 is in a range of about 50 to 100 millivolts as the operating temperature varies from −55 to 125 degrees Celsius.

The second resistor chain 98 affects a third predetermined divider voltage on a third divider node (VDIVC) 112. The third divider node (VDIVC) 112 is electrically connected with the drain of n-channel transistor 92 and the control gate of n-channel transistor 88 as illustrated in FIG. 3. The magnitude of the third predetermined divider voltage is controlled by the activation of n-channel transistor 92 and the resistance of the second resistor chain 98.

As n-channel transistor 92 becomes activated to pass more current, the magnitude of voltage at the third divider node (VDIVC) 112 is correspondingly lowered. In addition, variation of the resistance of the second resistor chain 98, as the operating temperature varies, provides a compensating offset of the third divider voltage. The compensating offset adjusts the magnitude of the third predetermined divider voltage to affect the magnitude of the bias voltage as further detailed below.

The magnitude of the third predetermined divider voltage controls activation of n-channel transistor 88. N-channel transistor 88 acts as a throttle of the predetermined supply voltage present on the voltage supply node (VSUP) 100. The magnitude of the bias voltage that is generated and directed to the wordlines 18 during the APDEV operation is controlled by n-channel transistor 88 working in conjunction with n-channel transistor 90.

Referring again to FIG. 3, the preferred source bias circuit 26 includes a NAND gate 114, a plurality of NOR gates 116–118, a plurality of inverters 120–122 and a plurality of n-channel transistors 124–126 electrically connected as illustrated. When activated by the state machine, n-channel transistors 124 and 126 pass a stress voltage to the wordlines 18. The stress voltage is supplied to the source bias circuit 26 on the ARVSSR bias line 40 during a stress operation. The stress operation is performed following the APDEV operation, the details of which are beyond the scope of the present invention.

The preferred discharge circuit 28 is also illustrated in FIG. 3 and includes a NOR gate 128, a plurality of NAND gates 130–132, a plurality of inverters 134–136 and an n-channel transistor 138 electrically connected as illustrated. The supply voltage (Vcc) connection 86 is also electrically connected with the discharge circuit 28. The discharge circuit 28 electrically connects the wordlines 18 with the ground connection 78 when n-channel transistor 138 is activated. In addition, the discharge circuit 28 initializes an output signal on the AWVENBn line 32 that activates the charge share circuit 12.

The discharge circuit 28 is activated by predetermined electric signals from the state machine on the ESP control line 46, the Program Reset line 48, the ERXTF control line 50 and the Automatic Program Disturb Erase line 52. The ESP control line 46 is conducting when the erase operation has been suspended. During the APDEV operation, the Program Reset line 48 and the ERXTF control line 50 are non-conducting and the Automatic Program Disturb Erase line 52 is conducting.

In the preferred embodiment, each memory sector 20 contains 512 individual wordlines 18 that are simultaneously charged by sequential application of the first predetermined voltage and the second predetermined voltage. The number of wordlines 18 in a respective memory sector 20 in the preferred embodiment is provided by way of example only and should not be construed as a limitation of the present invention. In the preferred embodiment, the second predetermined voltage charges the wordlines 18 in the respective memory sector 20 to the bias voltage in a second predetermined time period of about 540 nanoseconds.

During operation of the preferred temperature-compensated bias generator circuit 14, the magnitude of the third predetermined divider voltage is maintained close to the threshold voltage of n-channel transistor 88. As known in the art, the threshold voltage of a transistor is the magnitude of voltage that is applied between the control gate and the source to activate the transistor. The third predetermined divider voltage on the control gate of n-channel transistor 88 is modulated to control the voltage and current that generates the bias voltage. The generation of the bias voltage is also controlled by the first predetermined divider voltage at the control gate of n-channel transistor 90.

When the operating temperature of the preferred flash memory 10 increases, the voltage on the first divider node (VDIVA) 102 decreases at the first predetermined rate. In addition, the voltage on the second divider node (VDIVB) 104 decreases at the second predetermined rate. When the first predetermined divider voltage decreases, n-channel transistor 90 remains activated to pull down the voltage passed by n-channel transistor 88. In addition, the decrease in the second predetermined divider voltage modulates n-channel transistor 92 to pass less current and voltage to the ground connection 78.

The first predetermined divider voltage decreases at a slower rate than the third predetermined divider voltage such that the bias voltage is lowered by n-channel transistors 88 and 90. The third predetermined divider voltage decreases at a faster rate because the second rate of change of the resistance of the second block 108 is greater than the first rate of change of the resistance of the third block 110. The lower third predetermined divider voltage modulates n-channel transistor 88 to pass a lower magnitude of current and voltage to generate the bias voltage. The first predetermined divider voltage is maintained slightly higher than the third predetermined divider voltage so the bias voltage can be pulled down by n-channel transistor 90 at higher operating temperatures.

The resistance of the second resistor chain 98 also correspondingly increases as the operating temperature increases, thereby slightly lowering the magnitude of the third predetermined divider voltage. The variation of the resistance of the second resistor chain 98 creates the compensating offset to maintain linearity of the bias voltage as the operating temperature varies. The amount of compensating offset required is capable of calculation by those skilled in the art. Those skilled in the art would also understand that the temperature compensation of the first and second resistor chains 96, 98 also compensates for the changing threshold voltages of the n-channel transistors 88, 90 and 92 as the operating temperature varies.

The result of the increased operating temperature of the flash memory 10 is an almost linear decrease in the bias voltage generated by the temperature-compensated bias generator circuit 14. When the operating temperature of the flash memory 10 decreases, the opposite operations occur and the bias voltage increases in an almost linear fashion. The magnitude of the bias voltage that is directed to the wordlines 18 is thereby controlled by the resistor chain that comprises the first and second resistor chains 96, 98.

The temperature adjustment circuit 24 is stable when n-channel transistor 92 is activated by the second predetermined divider voltage to pass a relatively small predetermined current. The third predetermined divider voltage controls n-channel transistor 88 to generate the bias voltage that is about equal to the first predetermined divider voltage less the threshold voltage of n-channel transistor 88. In the preferred embodiment, the bias voltage is generated in an almost linear range of about 572 to 104 millivolts as the operating temperature varies in a range of about −55 to 125 degrees Celsius respectively.

When the APDEV operation is complete, the Program Verify line 38 stops conducting, thereby disabling the temperature-compensated bias generator circuit 14. The voltage in the first and second resistor chains 96, 98 is discharged by activation of n-channel transistor 86. In addition, the bias voltage on the wordlines 18 is discharged by the discharge circuit 28 when n-channel transistor 138 is activated by the conducting Program Reset line 48. As previously set forth, the APDEV operation will then repeat as necessary until the cells targeted for erasure have reached the proper erased state.

Figure 4:
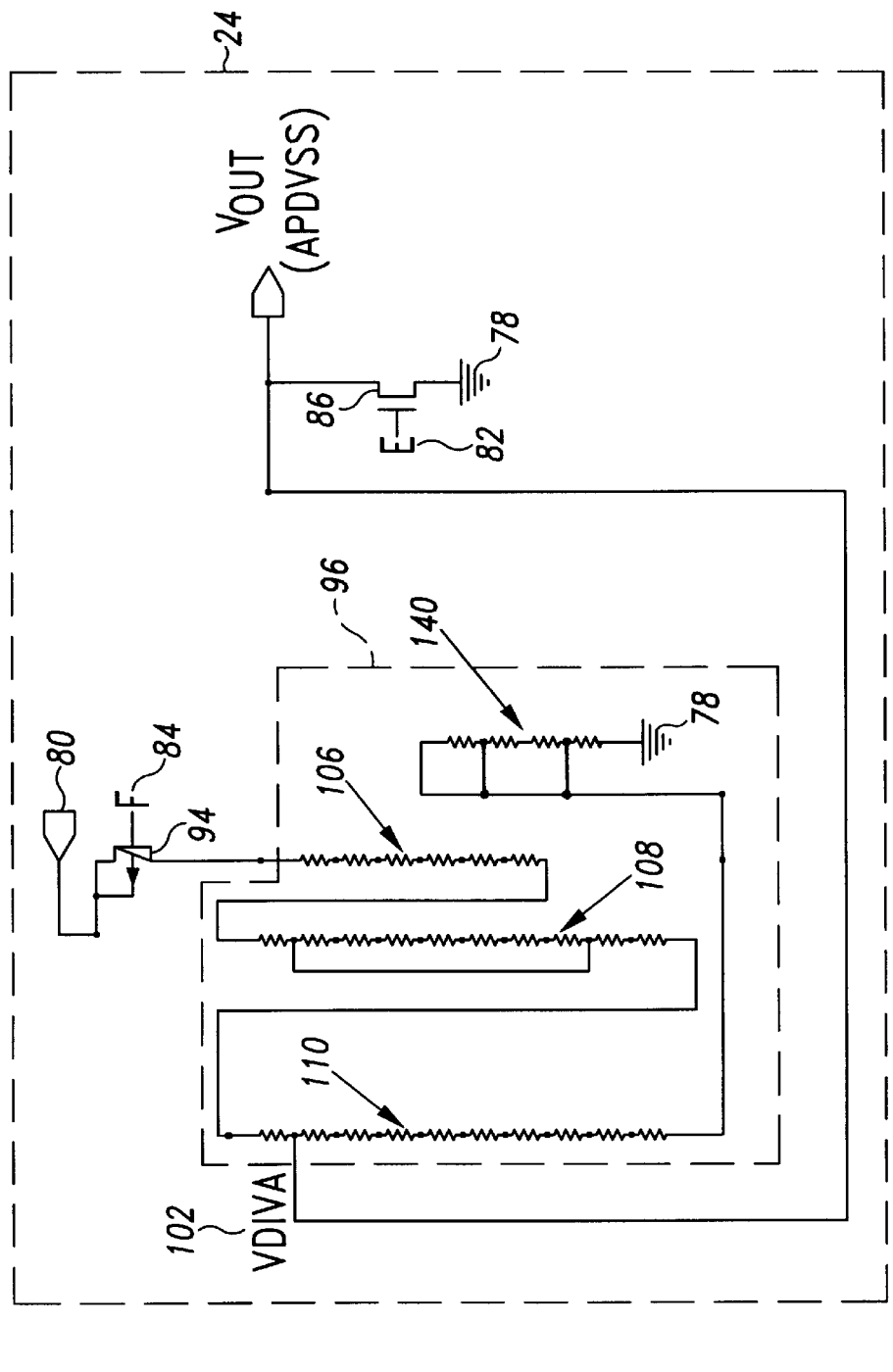
FIG. 4 is a circuit schematic of another preferred temperature-compensated bias generator circuit.

FIG. 4 illustrates a circuit schematic of another preferred embodiment of the temperature-compensated bias generator circuit 14. Although not illustrated, the temperature-compensated bias generator circuit 14 is electrically connected with at least one reference wordline 18. The preferred temperature-compensated bias generator circuit 14 includes the wordline enable circuit 22 (not shown) electrically connected with the temperature adjustment circuit 24. The preferred wordline enable circuit 22 is electrically connected and operates similarly to the previously set forth preferred embodiment.

The preferred temperature-compensated bias generator circuit 14 operates without the charge share circuit 12 to charge the reference wordlines 18 to the bias voltage during the APDEV operation. In this preferred embodiment, the reference wordlines 18 are not located in a respective memory sector 20 and are electrically connected with at least one reference cell (not shown). The reference cells provide the predetermined reference leakage current that is used during the APDEV operation as previously set forth. Those skilled in the art would recognize that wordlines describe the wordlines 18 of the previously disclosed preferred embodiment as well as the reference wordlines 18.

The preferred temperature adjustment circuit 24 includes n-channel transistor 86, p-channel transistor 94 and the first resistor chain 96 electrically connected as illustrated in FIG. 4. The temperature adjustment circuit 24 is activated by non-conducting electric signals from the wordline enable circuit 22 as set forth in the previous preferred embodiment. The predetermined supply voltage present on the regulated power supply connection 80 is passed to the first resistor chain 96 when p-channel transistor 94 is activated.

The first resistor chain 96 is a voltage divider that comprises a combination of p-plus and n-well resistors configured to provide a predetermined resistance as in the previous preferred embodiment. In this preferred embodiment, the first block 106 comprises n-well resistors, the second and third blocks 108, 110 comprise p-plus resistors and a fourth block 140 comprises n-well resistors. Voltage drop in the preferred first resistor chain 96 prior to the first voltage divider (VDIVA) 102 is provided by the first and second blocks 106, 108 and a portion of the p-plus resistors in the third block 110.

The bias voltage of this preferred embodiment is generated on the first voltage divider node (VDIVA) 102 and is based on the operating temperature of the flash memory 10. In this preferred embodiment, the bias voltage is in a range of about 765 to 522 millivolts as the operating temperature of the flash memory varies from about −55 to 125 degrees Celsius respectively. Those skilled in the art are capable of calculating the resistance of the first resistor chain 96 based on the range of the bias voltage and operating temperature. Since the range of the bias voltage is smaller than in the previous preferred embodiment, variations of the bias voltage with respect to operating temperature are almost linear.

The magnitude of the bias voltage is controlled by the first resistor chain 96. The bias voltage is directed to the reference wordlines 18 by at least one pass gate 16 to charge the reference wordlines 18 to the bias voltage. The reference cells generate the predetermined reference leakage current that is about 5 microamps in the preferred embodiment when the bias voltage is applied to the reference wordlines 18.

Those skilled in the art would recognize that the selective combination of the p-plus and n-well resistors of the first resistor chain 96 creates a different predetermined slope of changing resistance than the previously set forth preferred embodiment. The different predetermined slope of changing resistance provides temperature compensation of the bias voltage such that the reference leakage current remains almost constant as the operating temperature of the flash memory 10 varies. At the conclusion of the APDEV operation, the voltage present on the reference wordlines 18 and the first resistor chain 96 is dissipated by activation of n-channel transistor 86. N-channel transistor 86 is activated by the wordline enable circuit 22 as in the previously set forth preferred embodiment.

In another preferred embodiment, the reference leakage current can be adjusted to correspond to the size of at least one memory sector 20. Those skilled in the art would understand that the size of the memory sectors 20 refers to the number of cells in the bitlines that contribute to the leakage current during the APDEV operation. Adjustment of the reference leakage current is accomplished by applying the bias voltage to the reference wordlines 18 as in the previously set forth preferred embodiment.

In this preferred embodiment, the reference cells in the reference wordlines 18 are each associated with at least one memory sector 20. In addition, the reference cells are configured to generate a predetermined reference leakage current that corresponds to the size of the associated memory sectors 20. Adjustment of the reference leakage current is accomplished by sensing the reference leakage current of the reference cell that is associated with the respective memory sector 20 that is subjected to the APDEV operation.

In another preferred embodiment of the present invention, when the wordline enable circuit 22 is activated, both previously discussed preferred embodiments of the temperature-compensated bias generator circuit 14 are activated to control respective bias voltages. The respective bias voltages are transferred to the wordlines 18 in the memory sector 20 and the reference wordlines 18. The reference cells electrically connected with the reference wordlines 18 are activated to generate the reference leakage current. In addition, the cells electrically connected with the wordlines 18 in the respective memory sector 20 are activated to generate leakage current on the respective bitline. The leakage current on the bitlines in the respective memory sector 20 is then compared to the reference leakage current during the APDEV operation.

Since both the reference wordlines 18 and the wordlines 18 are charged to independent respective bias voltages that are temperature compensated, errors in the comparing the leakage current with the reference leakage current are minimized. Minimization of errors is accomplished by keeping the leakage currents under control. In the preferred embodiment, the bitline leakage current is less than 5 microamps at all operating temperatures of the flash memory 10 when a cell in a bitline in the respective memory sector 20 is read.

During the erase operation in the preferred flash memory 10, the time required to correct for excessive leakage current remains relatively uniform as the operating temperature varies because of the temperature compensation of the bias voltage. In addition, the APDEV operation is further improved by the use of the regulated power supply 34 to eliminate power supply variations and the use of the reference leakage current that corresponds to the size of the memory sector 20. The use of the charge share circuit 14 to improve the charging time of the wordlines 18 in the memory sector 20 also improves the efficiency of the APDEV operation.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A temperature-compensated bias generator circuit for generating a bias voltage during an APDEV operation in a memory device, comprising:
   a wordline enable circuit; and
   a temperature adjustment circuit electrically connected with said wordline enable circuit, wherein said temperature adjustment circuit is activated by said wordline enable circuit to generate said bias voltage.

2. The temperature-compensated bias generator circuit of claim 1, wherein said bias voltage is generated based on an operating temperature of said memory device.

3. The temperature-compensated bias generator circuit of claim 1, wherein said bias voltage is in a predetermined range of about 104 to 572 millivolts.

4. The temperature-compensated bias generator circuit of claim 1, wherein said temperature-compensated bias generator circuit also includes a source bias circuit and a discharge circuit.

5. The temperature-compensated bias generator circuit of claim 1, wherein said bias voltage is directed to at least one wordline electrically connected with said temperature adjustment circuit.

6. The temperature-compensated bias generator circuit of claim 1, wherein said bias voltage is directed to at least one reference wordline electrically connected with said temperature adjustment circuit.

7. The temperature-compensated bias generator circuit of claim 6, wherein said at least one reference wordline is electrically connected with at least one reference cell.

8. The temperature-compensated bias generator circuit of claim 7, wherein each of said at least one reference cells is associated with at least one memory sector.

9. The temperature-compensated bias generator circuit of claim 6, wherein said bias voltage is in a predetermined range of approximately 522 to 765 millivolts.

10. A temperature-compensated bias generator circuit for generating a bias voltage during an APDEV operation in a memory device, comprising:
    a temperature adjustment circuit, wherein said temperature adjustment circuit is supplied a predetermined supply voltage;
    a wordline enable circuit electrically connected with said temperature adjustment circuit wherein said wordline enable circuit activates said temperature adjustment circuit to generate said bias voltage; and
    a resistor chain located within said temperature adjustment circuit for controlling said predetermined supply voltage to generate said bias voltage based on an operating temperature of said memory device.

11. The temperature-compensated bias generator circuit of claim 10, wherein said predetermined supply voltage is about 5.0 V.

12. The temperature-compensated bias generator circuit of claim 10, wherein said bias voltage is in a predetermined range of about 104 to 572 millivolts.

13. The temperature-compensated bias generator circuit of claim 10, wherein said temperature-compensated bias generator circuit also includes a source bias circuit and a discharge circuit.

14. The temperature-compensated bias generator circuit of claim 10, wherein said bias voltage is directed to at least one wordline electrically connected with said temperature adjustment circuit.

15. The temperature-compensated bias generator circuit of claim 10, wherein said bias voltage is directed to at least one reference wordline electrically connected with said temperature adjustment circuit.

16. The temperature-compensated bias generator circuit of claim 15, wherein said at least one reference wordline is electrically connected with at least one reference cell.

17. The temperature-compensated bias generator circuit of claim 16, wherein each of said at least one reference cells is associated with at least one memory sector.

18. The temperature-compensated bias generator circuit of claim 15, wherein said bias voltage is in a predetermined range of approximately 522 to 765 millivolts.

19. A method of generating a bias voltage during an APDEV operation in a memory device, comprising the steps of:
    generating a predetermined supply voltage with a regulated power supply;
    directing said predetermined supply voltage to a temperature adjustment circuit;
    activating said temperature adjustment circuit with a wordline enable circuit; and
    generating said bias voltage with said predetermined supply voltage and a resistor chain located within said temperature adjustment circuit.

20. The method of claim 19, further comprising the step of transferring said bias voltage to at least one wordline.

21. The method of claim 19, wherein said predetermined supply voltage is about 5.0 V.

22. The method of claim 19, wherein said bias voltage is generated based on an operating temperature of said memory device.

23. The method of claim 19, wherein said bias voltage is in a predetermined range of about 104 to 572 millivolts.

24. The method of claim 19, further comprising the step of transferring said bias voltage to at least one reference wordline.

25. The method of claim 24, wherein said bias voltage is in a predetermined range of about 522 to 765 millivolts.

26. The method of claim 24, further comprising the step of generating a predetermined reference leakage current with at least one reference cell electrically connected with said at least one reference wordline.

27. The method of claim 26, wherein each of said at least one reference cells is associated with at least one memory sector.

* * * * *